United States Patent
Hirata et al.

(10) Patent No.: US 8,047,510 B2
(45) Date of Patent: Nov. 1, 2011

(54) EVAPORATION SUPPLY APPARATUS FOR RAW MATERIAL AND AUTOMATIC PRESSURE REGULATING DEVICE USED THEREWITH

(75) Inventors: Kaoru Hirata, Osaka (JP); Masaaki Nagase, Osaka (JP); Atsushi Hidaka, Osaka (JP); Atsushi Matsumoto, Osaka (JP); Ryousuke Dohi, Osaka (JP); Kouji Nishino, Osaka (JP); Nobukazu Ikeda, Osaka (JP)

(73) Assignee: Fujikin Incorporated, Osaka (JP)

( * ) Notice: Subject to any disclaimer, the term of this patent is extended or adjusted under 35 U.S.C. 154(b) by 508 days.

(21) Appl. No.: 12/306,904

(22) PCT Filed: Jun. 13, 2007

(86) PCT No.: PCT/JP2007/000628
§ 371 (c)(1),
(2), (4) Date: Dec. 29, 2008

(87) PCT Pub. No.: WO2008/001483
PCT Pub. Date: Jan. 3, 2008

(65) Prior Publication Data
US 2010/0012026 A1    Jan. 21, 2010

(30) Foreign Application Priority Data
Jun. 27, 2006   (JP) .................... 2006-177113

(51) Int. Cl.
*B01F 3/04*   (2006.01)
(52) U.S. Cl. ......... 261/129; 261/135; 261/39.1; 261/65; 261/121.1

(58) Field of Classification Search .................. 261/129, 261/131, 135, 142, 39.1, 62, 64.3, 65, 72.1, 261/121.1; 118/666; 137/468
See application file for complete search history.

(56) References Cited

U.S. PATENT DOCUMENTS
4,436,674 A * 3/1984 McMenamin ............... 261/64.3
(Continued)

FOREIGN PATENT DOCUMENTS
EP    0390127 A2   3/1989
(Continued)

OTHER PUBLICATIONS
International Search Report issued in corresponding application PCT/JP2007/000623, completed Sep. 5, 2007 and mailed Sep. 18, 2007.

*Primary Examiner* — Charles Bushey
(74) *Attorney, Agent, or Firm* — Griffin & Szipl, P.C.

(57) ABSTRACT

An evaporation supply apparatus for raw material used in semiconductor manufacturing includes a source tank in which a raw material is pooled; a flow rate control device that supplies carrier gas at a regulated flow rate into the source tank; a primary piping path for feeding mixed gas $G_0$, made up of raw material vapor $G_4$ and carrier gas $G_1$, an automatic pressure regulating device that regulates a control valve based on the detected values of the pressure and temperature of mixed gas $G_0$ to regulate the cross-sectional area of the passage through which the mixed gas $G_0$ is distributed so as to hold the pressure of the mixed gas $G_0$ inside the source tank constant; and a constant-temperature heating unit for heating the source tank to a set temperature, in which mixed gas $G_0$ is supplied to a process chamber while controlling the pressure inside the source tank.

8 Claims, 10 Drawing Sheets

U.S. PATENT DOCUMENTS

| | | | |
|---|---|---|---|
| 5,288,325 A * | 2/1994 | Gomi | 118/692 |
| 5,336,356 A * | 8/1994 | Ban et al. | 156/345.26 |
| 5,730,423 A | 3/1998 | Wu et al. | |
| 5,803,938 A * | 9/1998 | Yamaguchi et al. | 261/130 |
| 2004/0188866 A1 * | 9/2004 | Sivaramakrishnan et al. | 261/62 |

FOREIGN PATENT DOCUMENTS

| | | |
|---|---|---|
| EP | 0419939 | 4/1991 |
| JP | 60-102251 | 7/1985 |
| JP | 2-255595 A | 10/1990 |
| JP | 3-97692 A | 4/1991 |
| JP | 3-97693 | 4/1991 |
| JP | 2611008 | 2/1997 |
| JP | 2611009 | 2/1997 |
| JP | 2600383 | 8/1999 |
| JP | 2001-525909 A | 12/2001 |

\* cited by examiner

Flow rate property (relationship between piezoelectric voltage and flow rate)
(Used gas: N2, Seat diameter: φ6, Diaphragm retainer: invar 36% (with silver plate))

(a)

Flow rate property (relationship between piezoelectric voltage and flow rate)
(Used gas: N2, Seat diameter: φ6, Diaphragm retainer: SUS316)

(b)

Flow rate property (relationship between piezoelectric voltage and flow rate)
(Used gas: N2, Seat diameter: φ6, Diaphragm retainer: Vespel (SP-1))

EVAPORATION SUPPLY APPARATUS FOR RAW MATERIAL AND AUTOMATIC PRESSURE REGULATING DEVICE USED THEREWITH

This is a National Phase Application in the United States of International Patent Application No. PCT/JP2007/000628 filed Jun. 13, 2007, which claims priority on Japanese Patent Application No. 2006-177113, filed Jun. 27, 2006. The entire disclosures of the above patent applications are hereby incorporated by reference.

FIELD OF THE INVENTION

The present invention relates to an evaporation supply apparatus for the raw material used in a semiconductor manufacturing apparatus configured to form a thin film on a substrate by a so-called metal organic chemical vapor deposition method (hereinafter referred to as "MOCVD method"). In particular, the present invention relates to an evaporation supply apparatus for a raw material, in which the pressure inside a source tank is controlled with high accuracy so as to supply the process chamber with mixed gas having a mixture ratio of raw material vapor to carrier gas that is constant and a flow rate that is exactly controlled to a set flow rate, thereby efficiently manufacturing a high-quality semiconductor. In addition, the present invention relates to an automatic pressure regulating device used therewith.

BACKGROUND OF THE INVENTION

Figure 9:
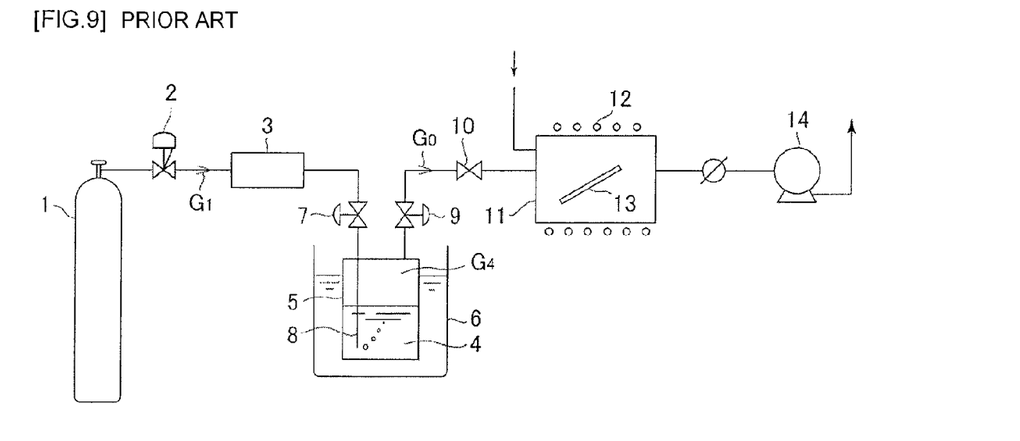
FIG. 9 is an explanatory diagram showing one example of an evaporation supply apparatus of a raw material in a bubbling system used in a conventional MOCVD method.

As shown in FIG. 9, conventionally, when manufacturing semiconductors to form an epitaxial thin film by the MOCVD method, carrier gas $G_1$ such as $H_2$ is fed into a pool of raw material 4 in a source tank 5. The liquid-state raw material 4 is stirred by foaming and the raw material 4 is brought into contact with the carrier gas $G_1$ which, at a predetermined temperature, promotes the generation of saturated vapor $G_4$ from the raw material 4. Mixed gas $G_0$, made up of the saturated vapor $G_4$ from the raw material 4 combined with the carrier gas $G_1$, is fed into process chamber 11. FIG. 9 shows a liquid-state raw material (for example, an organometallic compound) 4 pooled inside the source tank 5. However, it is also common to use a solid raw material 4 carried by a porous supporting member located inside the source tank 5 and gas (raw material vapor $G_4$) sublimated from the solid raw material 4.

In FIG. 9, reference numeral $G_1$ represents a carrier gas; $G_4$ represents a saturated vapor of a raw material; $G_0$ represents a mixed gas; 1 designates a carrier gas source (container) such as hydrogen; 2 designates a decompressor; 3 designates a mass flow control device; 4 designates a raw material; 5 designates a source tank; 6 designates a constant temperature reservoir; 7 designates an inlet valve; 8 designates a lead-in tube; 9 designates an outlet valve; 10 designates a valve; 11 designates a process chamber (a crystal growth furnace); 12 designates a heater; 13 designates a substrate; and 14 designates a vacuum pump.

In the apparatus shown in FIG. 9, using a system in which pressure control of the temperature of the constant temperature reservoir 6 (which controls the saturated vapor $G_4$ of the raw material 4) and flow rate control of the carrier gas $G_1$ are superimposed allows the supply amount of the raw material 4 (an epitaxial raw material) to the process chamber 11 to be controlled. However, it proves difficult to highly accurately control the mixture ratio between gases $G_1$ and $G_4$ or the supply flow rate of the mixed gas $G_0$. As a result, variation may easily occur in film thickness or film composition, and thus, the properties of the manufactured semiconductor are not stabilized, which results in the drawback of a lack of consistency.

In the evaporation supply apparatus shown in FIG. 9, in order to achieve highly accurate flow rate control of the mixed gas $G_0$, the pressure of the vapor $G_0$ inside the source tank 5 must be held at a constant set value at all times. However, in the conventional evaporation supply apparatus shown, in the supply system that supplies mixed gas to process chamber 11, only valves 9 and 10 are included, and little consideration is given to this point of the process. As a result, the highly accurate control of the supply amount of the mixed gas $G_0$ is significantly difficult.

Figure 10:
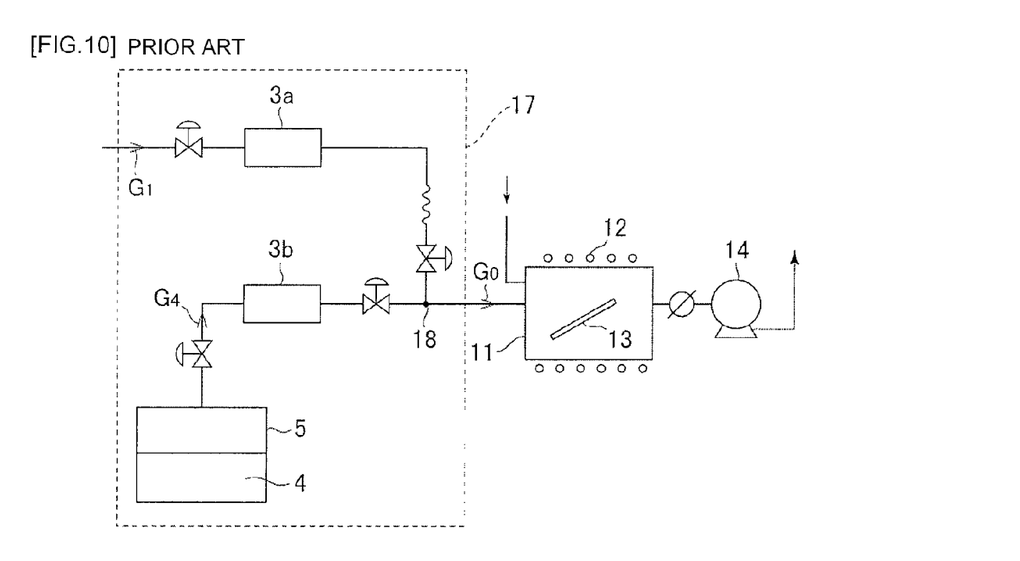
FIG. 10 shows an evaporation supply apparatus used in the conventional MOCVD method and is an explanatory diagram of an apparatus configured so that a flow rate of a carrier gas and that of a raw material are individually measured, and in this state, substances are mixed and supplied.

To solve this problem, as shown in FIG. 10, a control system for the raw material supply amount has been developed in which the supply system of the raw material vapor $G_4$ and the supply system of the carrier gas $G_1$ are completely separated so that control of the supply amount of the raw material vapor $G_4$ and control of the supply amount of the carrier gas $G_1$ are independently performed. This system has already been put into practical use. In FIG. 10, reference numerals 3a and 3b denote mass flow control devices; 12 denotes a heater; 17 denotes an constant air temperature reservoir; and 18 denotes a mixture unit.

In the control system in FIG. 10, use of a plurality of mass flow control devices 3a and 3b results in two flow rate control systems. Thus, the evaporation supply apparatus is complicated and large, and obtaining a uniform mixture of carrier gas $G_1$ and vapor $G_4$ in the mixture unit 18 is difficult. As a result, it has gradually become apparent that in terms of stability of the properties of a manufactured semiconductor, there is no significant difference between the evaporation supply apparatuses shown in FIG. 9 and FIG. 10.

Further, in recent years, in this type of evaporation supply apparatus, in order to implement a further downsizing of the apparatus and an increase in raw material supply amount, there has been a strong demand to increase the pressure of the raw material vapor $G_4$ and to more highly accurately control the mixture ratio between the carrier gas $G_1$ and the vapor $G_4$ and the supply amount thereof.

In the evaporation supply apparatuses shown in FIG. 9 and FIG. 10, it is difficult to respond to the demand to downsize the evaporation supply apparatus, increase in vapor supply amount, and control of the mixture ratio and the mixed gas supply amount with high accuracy.

[Patent Document 1] Japanese Laid-Open Patent Publication No. 2611008
[Patent Document 2] Japanese Laid-Open Patent Publication No. 2611009
[Patent Document 3] Japanese Utility Model Registration No. 2600383

DISCLOSURE OF THE INVENTION

Problem to be Solved by the Invention

The present invention solves the aforementioned problem in evaporation supply apparatuses used in the conventional MOCVD method, i.e., the problem that it is not possible to simultaneously achieve parallel downsizing of the evaporation supply apparatus, an increase in supply amount of a raw material, and highly refined accuracy control of the mixture ratio of the raw material and the amount of mixed gas supplied. In the present invention, a conventional evaporation supply apparatus using a bubbling system or a solid raw material system is used as a base and a high temperature mixed gas system is implemented. In addition, the inner pressure of the source tank is automatically held at a set pressure value at all times in order to simultaneously achieve an increase in the amount of raw material supplied, refined accuracy control of the mixture ratio and amount of mixed-gas supplied, and downsizing of the evaporation supply apparatus, and also provide an automatic pressure regulating device used therewith.

Means for Solving the Problem

The evaporation supply apparatus of the conventional bubbling system shown in the foregoing FIG. 9 was reconsidered, and an evaporation supply apparatus for a raw material of a bubbling system or a solid fuel method was used as a base for carrying out various types of investigations and tests, for example: the relationship between the heating temperature of the source tank, etc., and the vapor pressure and the vapor generation amount of the raw material 4; the relationship between the heating temperature and the mixture ratio of mixed gas; the relationship between the heating temperature and accuracy control of the amount of the mixed gas $G_0$ supplied; and the relationship between the inner pressure fluctuation inside the source tank and accuracy control of the amount of the mixed gas $G_0$ supplied. From results of these investigations, tests, etc., the inventors learned that in the conventional evaporation supply apparatus, the supply amount of the mixed gas $G_0$ was determined by the temperature and the pressure of the source tank, the flow rate of carrier gas $G_1$, and, among other things, suppressing the fluctuation of the inner pressure of the source tank. Holding the inner pressure at a predetermined value was necessary to achieve an increase in supply amount of the mixed gas $G_0$ and highly refined accuracy of the flow rate control. The problem addressed by the present invention was solved by arranging an automatic regulating device for the source tank inner pressure to which a high-temperature countermeasure was applied to the process chamber mixed gas $G_0$ supply line.

The present invention in accordance with a first embodiment includes: a source tank in which a raw material is pooled; a flow rate control device that, while regulating a flow rate of carrier gas $G_1$ at a constant flow rate from a carrier gas supply source, supplies the carrier gas $G_1$ into the raw material in the source tank; a primary piping path for feeding mixed gas $G_0$ made up of raw material vapor $G_4$ and carrier gas $G_1$ pooled in an upper space of the source tank; an automatic pressure regulating device that regulates the opening degree of a control valve interposed in the tail end of the primary piping path based on detected values of the pressure and temperature of mixed gas $G_0$ in the primary piping path to regulate the cross-sectional area of the passage through which the mixed gas $G_0$ is distributed so as to hold the pressure of the mixed gas $G_0$ inside the source tank at a constant value; and a constant-temperature heating unit for heating the source tank and parts (excluding an arithmetic control unit of the automatic pressure regulating device) to a set temperature, in which the mixed gas $G_0$ is supplied to the process chamber while controlling the pressure inside the source tank to a desired pressure.

In addition, the invention in accordance with a second embodiment includes, that the highest value of the heating temperature by the constant-temperature heating unit is set at 150° C.

In addition, in accordance with a third embodiment, the invention includes that the control valve of the automatic pressure regulating device is a piezoelectric-element-driven normally-closed metal diaphragm valve, and that a diaphragm retaining member for pressing a diaphragm valve body of the metal diaphragm valve is made of invar (36% Ni—Fe).

The invention in accordance with a fourth embodiment includes: a pressure detector P, interposed in the primary piping path that supplies mixed gas $G_0$ made up of raw material vapor $G_4$ and carrier gas $G_1$ fed from the source tank of the evaporation supply apparatus, for detecting the inner pressure of the mixed gas $G_0$; a temperature detector T for detecting the temperature of the mixed gas $G_0$; a piezoelectric-element-driven metal-diaphragm control valve directly connected to the tail end of the primary piping path; an arithmetic control unit for performing the temperature correction of the detected value of the pressure detector P based on the value detected by the temperature detector T so as to compute the pressure of the mixed gas $G_0$ and output a control signal Pd to control opening and closing of the control valve in a direction, obtained by comparing the previously set pressure and the computed pressure, in which the difference between the two pressures is small; and a heater for heating the pressure detector, the temperature detector, and the valve body of the control valve to a predetermined temperature, in which the inner pressure of the mixed gas inside the source tank is held at a predetermined value so as to highly accurately control the supply flow rate of the raw material.

In addition, in accordance with a fifth embodiment, the invention further includes that the arithmetic control unit is configured to include: a temperature correction circuit for temperature-correcting the detected pressure signal $P_0$ to compute a detected pressure signal Pt; an input/output circuit for a set input signal Ps and a controlled-pressure output signal $P_0t$; a comparison circuit for the detected pressure signal Pt and the set input signal Ps; and an output circuit for outputting a control signal Pd in a direction in which the difference signal between the detected pressure signal Pt and the set input signal Ps is rendered zero.

In addition, in accordance with a sixth embodiment of the invention further includes that the maximum heating temperature of the valve body is set at 150° C. and a diaphragm retainer of the control valve is made of invar (36% Ni—Fe).

In addition, in accordance with a seventh embodiment of the invention further includes that the control valve is configured so that the main body of the case is a holed chassis provided with a large number of opening holes, and is a normally closed control valve in which at the time of non-actuating a piezoelectric element drive unit, a diaphragm valve body is downwardly pressed via the diaphragm retainer by elastic force of a disc spring that is in contact with the valve seat and at the time of actuating the piezoelectric element drive unit the diaphragm retainer is upwardly pulled up against the elastic force of the disc spring by extension of the piezoelectric element, whereby the diaphragm valve body is unseated from the seat valve.

In addition, in accordance with an eighth embodiment of the invention further includes that one or both of the diaphragm retainer and the top surface side of the diaphragm is plated with silver so as to prevent seizing caused by friction between the diaphragm retainer and the diaphragm.

Effects of the Invention

The invention according to the first embodiment is configured such that: the flow rate carrier gas $G_1$ to the source tank 5 is controlled with high accuracy to a predetermined flow rate by the mass flow control device 3; the source tank, etc., is heated to a high temperature of up to 150° C. to promote evaporation of the raw material inside the source tank; and the pressure of the mixture between the carrier gas $G_1$ inside the source tank 5 and the raw material vapor $G_4$ is controlled with high accuracy to a predetermined value by the automatic pressure regulating device. Thus, the flow rate of the mixed gas $G_0$ fed into process chamber 11 and the mixture ratio of carrier gas $G_1$ to vapor $G_4$ inside the mixed gas $G_0$ is held constant at all times, which allows a desired amount of raw material 4 to be stably supplied to the process chamber at all times. As a result, a significant improvement in the quality of the manufactured semiconductor product and a reduction in the number of defective products is possible.

The automatic pressure regulating device of the fourth embodiment is configured such that a piezoelectric-element-driven metal-diaphragm control valve is used; a pressure detected value on a primary side of the control valve $V_0$ is used as a reference to perform opening/closing of the control valve; and the valve main body is heated to a high temperature of up to 150° C. and at the same time, the diaphragm retainer is made of invar. As a result, even when the temperature of the mixed gas inside the source tank to be controlled is raised up to 150° C., the pressure of the mixed gas inside the source tank can be controlled with high accuracy to a predetermined value. Thus, the flow rate of the mixed gas $G_0$ supplied to the process chamber and the mixture ratio of the carrier gas $G_1$ to the organic compound vapor $G_4$ can be controlled with high accuracy, and as a result, the stability of the quality of the semiconductor product can be significantly improved.

BRIEF DESCRIPTION OF THE DRAWINGS

FIGS. 5(a), 5(b), and 5(c) are graphs showing the relationship between the piezoelectric voltage and the $N_2$ flow rate when the body temperature of the control valve $V_0$ is changed, in which FIG. 5(a) shows the case where the diaphragm retainer is an invar (36% Ni—Fe) material, FIG. 5(b) shows the case where the diaphragm retainer is an SUS316 material, and FIG. 5(c) shows the case where the diaphragm retainer is a Vespel (SP-1) material.

FIGS. 8(a) and 8(b) show results of the response property test performed in FIG. 7, in which FIG. 8(a) shows a response property in a control capacity of 300 cc ($N_2$ flow rate: 150 SCCM) and FIG. 8(b) shows a response property in a control capacity of 530 cc ($N_2$ flow rate: 150 SCCM), respectively.

DESCRIPTION OF REFERENCE NUMERALS

1 Carrier gas
2 Decompressor
3 Mass flow control device
4 Raw material
5 Source tank (container)
6 High-temperature heating unit
7 Inlet valve
8 Lead-in tube
9 Outlet valve
10 Valve
11 Process chamber (crystal growth furnace)
12 Heater
13 Substrate
14 Vacuum pump
15 Automatic pressure regulating device for source tank
16 Arithmetic control unit
16a Temperature correction circuit
16b Comparison circuit
16c Input/output circuit
16d Output circuit
17 Input signal terminal (set input signal)
18 Output signal terminal (pressure output signal)
$G_1$ Carrier gas
$G_4$ Saturated vapor of raw material
$G_0$ Mixed gas
$G_5$ Thin-film formation gas
$L_1$ Primary piping path
$PG_1$ Barometer
P Pressure detector
T Temperature detector
$P_0$ Detected pressure signal
$T_0$ Detected temperature signal
$V_0$ Control valve
$V_1$ to $V_4$ Valves
Ps Input signal of set pressure
Pt Detected pressure signal after temperature correction (corrected pressure signal)
Pd Control signal to control valve
$P_0$t Output signal of controlled pressure signal (pressure detection signal after temperature correction of mixed gas $G_0$)
19 Valve body
19a Securing member
20 Piezoelectric element drive unit
21 Actuator box
21a Diaphragm retainer
22 Disc spring
23 Pressure sensor
24 Diaphragm valve body
25 Valve seat
26 Fluid path
27 Case main body (chassis)
28 Gasket
29 Gasket 30 Thermistor
31 Cartridge heater

BEST MODE FOR CARRYING OUT THE INVENTION

Embodiments of the present invention will now be described with reference to the figures.

Figure 1:
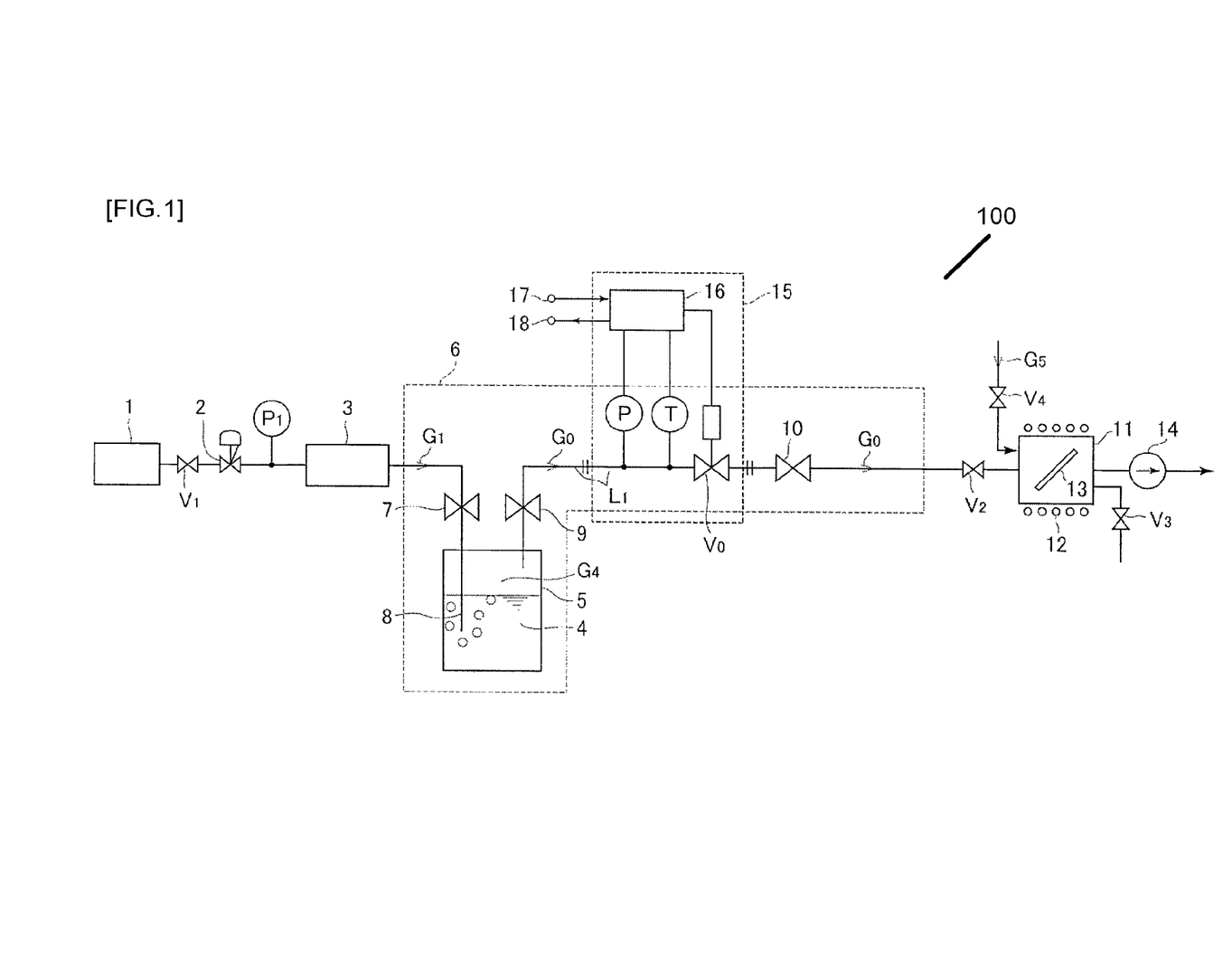
FIG. 1 is a component schematic diagram of an embodiment showing the main parts of an evaporation supply apparatus for a raw material according to the present invention.

FIG. 1 is a schematic diagram showing the main components of the evaporation supply apparatus for a raw material according to the present invention. In FIG. 1, reference numeral 1 designates a carrier gas supply source; 2 designates a decompressor; 3 designates a mass flow control device; 4 designates a raw material (liquid raw material such as Al $(CH_3)_3$ or supported sublimation solid raw material such as $Pb(dpm)_2$); 5 designates a source tank; 6 designates a high-temperature heating unit; 7, 9, and 10 designate valves; 8 designates a lead-in tube; 11 designates a process chamber, 14 designates a vacuum pump; 15 designates an automatic pressure regulating device in the source tank; 16 designates an arithmetic control unit; 17 designates an input terminal of a set pressure signal; 18 designates an output terminal of a detected pressure signal; $G_1$ refers to a carrier gas such as $H_2$; $G_4$ refers to a saturated vapor of a raw material; $G_0$ refers to a mixed gas composed of the carrier gas $G_1$ and the raw material vapor $G_4$, P refers to a pressure detector for the mixed gas $G_0$, T refers to a temperature detector for mixed gas $G_0$; $V_0$ refers to a piezoelectric-element-driven control valve; and $G_5$ refers to another raw material gas ($PH_3$, etc.) for binding with a raw material (e.g., Al $(CH_3)_3$) in the mixed gas $G_0$ so as to form a crystal thin film on substrate 13.

The carrier gas supply source 1 and the process chamber 11 in the evaporation supply apparatus for a raw material 100 shown in FIG. 1 are substantially the same as those in the apparatus shown in FIG. 9, except that the heating temperature of the carrier gas supply source 1 is set relatively high at about 150° C. Therefore, a detailed description has been omitted herein.

The automatic pressure regulating device 15 is located on the outlet side of the mixed gas $G_0$ from the source tank 5 and automatically regulates the pressure of the mixed gas $G_0$ in the source tank 5 to a predetermined setting value. Specifically, the pressure and temperature of mixed gas $G_0$ are detected in the primary tubing $L_1$ on the inflow side and are converted to digital values $P_0$ and $T_0$ respectively. The detected pressure signal $P_0$ and temperature signal $T_0$ are fed into the arithmetic control unit 16 which computes a corrected pressure signal Pt, of the high-temperature mixed gas $G_0$. Furthermore, the computed corrected pressure value, Pt, of the mixed gas $G_0$ and the set pressure value $P_s$ from the set input terminal 17 are compared to control opening and closing of the control valve $V_0$ until the deviation between the two values becomes zero.

Figure 2:
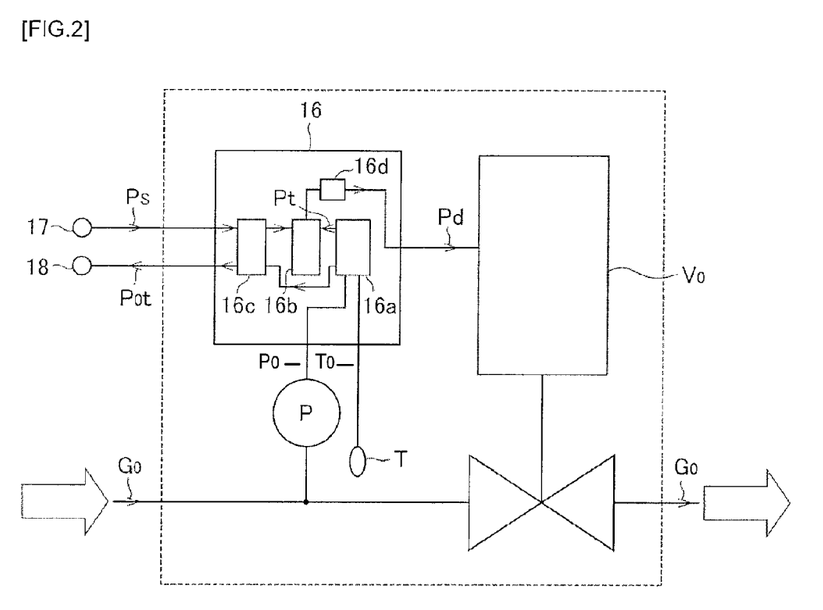
FIG. 2 is a block diagram of an embodiment of the present invention showing an automatic pressure measuring device of the inner pressure of the source tank.

FIG. 2 shows a block configuration of the automatic pressure regulating device 15. The arithmetic control unit 16 includes a temperature correction circuit 16a, a comparison circuit 16b, an input/output circuit 16c, and an output circuit 16d.

In particular, the detected values from pressure detector P and temperature detector T are converted to digital signals $P_0$ and $T_0$ respectively, and input into the temperature correction circuit 16a. The detected pressure signal $P_0$ is corrected to a corrected pressure signal Pt and is then input into the comparison circuit 16b. A set pressure input signal Ps is input from the terminal 17 to the input/output circuit 16c to be converted to a digital value. Then, the digital value is input into the comparison circuit 16b, in which it is compared to the detected pressure signal Pt. When the set pressure input signal Ps is greater than the detected pressure signal Pt, a control signal Pd is output into a drive unit of the control valve $V_0$ which drives the control valve $V_0$ in a closing direction, until the difference (Ps−Pt) between the set pressure input signal Ps and the corrected pressure signal Pt becomes zero.

Conversely, when the set pressure input signal Ps is smaller than the corrected pressure signal Pt, the control signal Pd is output into the drive unit of the control valve $V_0$ which drives the control valve $V_0$ in an opening-valve direction until the difference (Ps−Pt) between the two signals becomes zero.

The amount of the carrier gas $G_1$ supplied is held at a set value by the mass flow control device 3. In addition, the temperature of the source tank 5 and the internal pressure (pressure of the mixed gas $G_0$) of the source tank 5 are held at set values. Thus, while being supplied to the process chamber 11, the flow rate of mixed gas $G_0$ is controlled with high accuracy through control valve $V_0$ at a constant mixture ratio and a predetermined flow rate value that is proportional to the flow rate set by the mass flow control device 3.

In the present invention, the pressure $P_1$ of the carrier gas $G_1$ supplied to the source tank 5 is first set to a predetermined pressure value by the decompressor 2, and the supplied flow rate is set to a predetermined value by the mass flow controller 3.

Furthermore, by actuating the constant-temperature heating unit 6, the source tank 5 and parts, with the exception of the arithmetic control unit 16 in the automatic pressure regulating device 15, are heated and held at a high temperature of approximately 150° C.

The reason for heating and holding the source tank 5 and the control valve $V_0$ of the automatic pressure regulating device 15, etc., at a high temperature of 150° C. is to increase the pressure $P_0$ of the saturated vapor $G_4$ of the raw material 4 in the source tank 5 to respond to the increase in the supply amount of vapor $G_4$ to the process chamber 11 side and the demand for an increase in the temperature of the mixed gas $G_0$, while more completely preventing condensation of the vapor $G_4$ in the supply line of the mixed gas $G_0$.

Table 1 shows major specifications of the automatic pressure regulating device 15 used in this embodiment, in which the maximum operating temperature is 150° C., and the maximum pressure (F.S. pressure) at a flow rate 500 SCCM ($N_2$) is 133.3 kpa abs.

TABLE 1

| Main specification of automatic pressure regulating device | |
|---|---|
| Name | Reverse-acting pressure controller |
| Pressure range (F.S. pressure) | 133.8 kPa abs. (1000 Torr) Flow rate: 500 SCCM ($N_2$) |
| Secondary side pressure | Equal to or less than set control pressure |
| Withstanding pressure | 0.35 MPa G |
| External leak amount | Equal to or less than 1 × 10 − 10 Pam3/sec |
| Internal leak amount | 1% Equal to or less than F.S. (at the time of supply pressure of 300 kPa abs.) |
| Accuracy guaranteed temperature range | 15° C. to 150° C. |
| Usable temperature range | 0° C. to 160° C. |
| Ambient temperature | 15° C. to 50° C. |

TABLE 1-continued

Main specification of automatic pressure regulating device

| Name | Reverse-acting pressure controller |
|---|---|
| Quality of material of gas-contact portion | SUS316L, nickel-cobalt alloy, Hastelloy C-22 (pressure sensor) |
| Attaching posture | To be attached in all directions |

FIG. 3(a) is a sectional schematic view and FIG. 3(b) is a partially broken out left side schematic view of the control valve $V_0$ used in the automatic pressure regulating device 15 depicted in FIG. 2, in which valve component members such as a piezoelectric actuator or a disc spring can be used at a high-temperature so as to increase the operating temperature up to 150° C. In consideration of the heat expansion of the piezoelectric element or each component member of the valves, an invar material is used for a diaphragm retainer in order to prevent occlusion of the flow path due to the expansion of a piezoelectric element drive unit.

Furthermore, a housing case for the piezoelectric element drive unit is made in a holed chassis, and the piezoelectric element drive unit and associated parts are made with an air-coolable structure so as to reduce the heat expansion of each component part of the piezoelectric valve. A cartridge heater is attached on the body part of the control valve $V_0$ so as to heat the valve main body to a predetermined temperature (a maximum of 150° C.).

Moreover, the entire diaphragm retainer is plated with silver in order to reduce wear caused by friction with the diaphragm.

It should be noted that although only the diaphragm retainer is plated with silver in the embodiment, the top surface side of the diaphragm can be plated with silver instead, or the diaphragm retainer and the top surface side of the diaphragm can both be plated with silver in order to reduce wear caused by friction with the diaphragm retainer.

Figure 3:
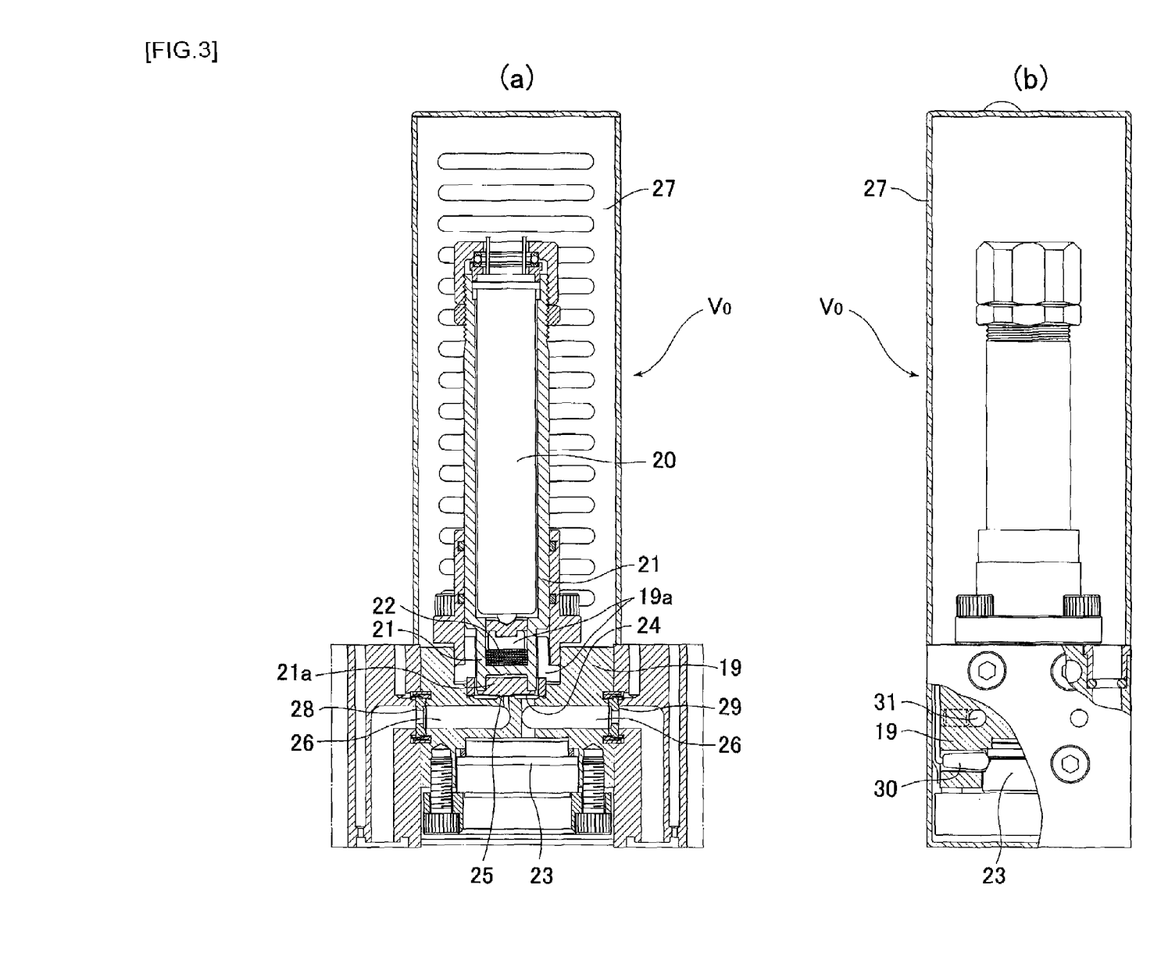
FIG. 3a is a sectional schematic view of an embodiment of the present invention showing the control valve $V_0$.
FIG. 3b is a partially broken out right side schematic view of an embodiment of the present invention showing the control valve $V_0$.

With the exception of the configurations discussed herein, the rest of the basic configuration of the control valve $V_0$ shown in FIG. 3 is well known except for each inventive step described above. Therefore, the description thereof is omitted herein.

In FIG. 3, reference numeral 19 denotes a valve body; 19a denotes a securing member; 20 denotes a piezoelectric element drive unit; 21 denotes an actuator box; 21a denotes a diaphragm retainer; 22 denotes a disc spring; 23 denotes a pressure sensor; 24 denotes a diaphragm valve body; 25 denotes a valve seat; 26 denotes a fluid path; 27 denotes a case main body (chassis); 28 and 29 denote gaskets; 30 denotes a thermistor; and 31 denotes a cartridge heater.

With reference to FIG. 3, when electrical power is not supplied to the piezoelectric element drive unit 20 (during a non-actuating time), the elastic force of the disc spring 22 presses the diaphragm valve body 24 downwardly via the actuator box 21 and the diaphragm retainer 21a secured at the lower end, thereby bringing the diaphragm valve body 24 into contact with the valve seat 25. Thus, the valve is held at a closed state.

Next, when electrical power for driving is supplied to the piezoelectric element drive unit 20, the piezoelectric element is extended. However, the lower end portion of the piezoelectric element is supported and secured by the securing member 19a, and the extension of the piezoelectric element allows the position of the upper end portion to be raised, thereby lifting the actuator box 21 upwardly against the elastic force of the disc spring 22. Thereby, the diaphragm valve body 24 is unseated from the valve seat 25, resulting in opening of the valve.

Figure 4:
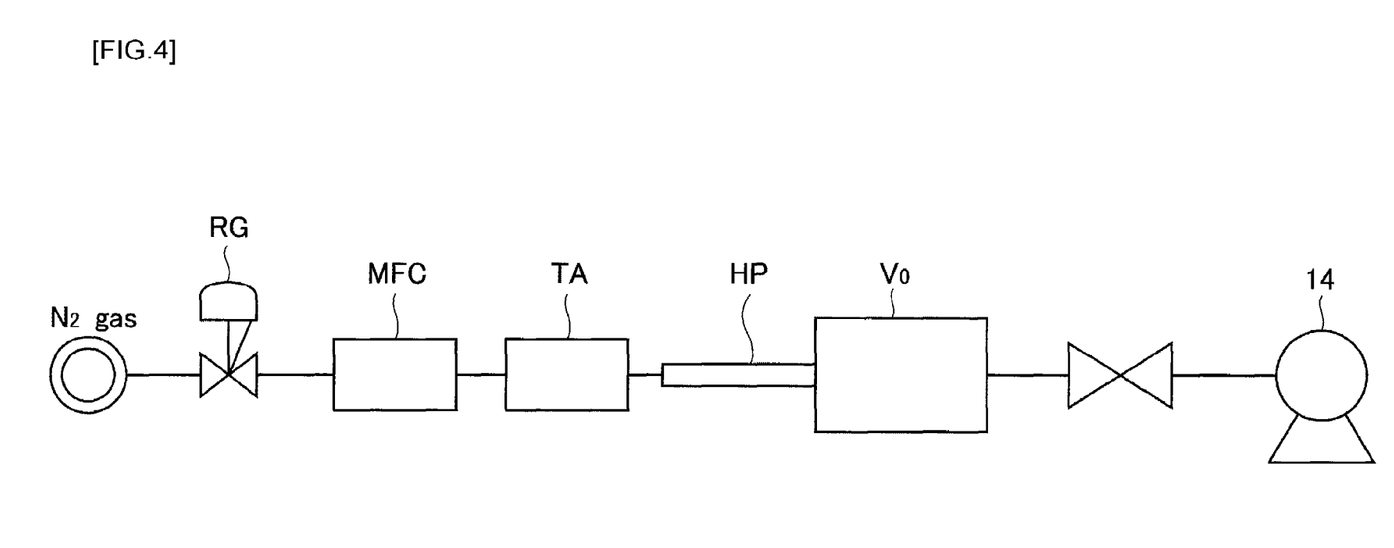
FIG. 4 is an illustrative diagram of an embodiment of the present invention for performing a flow-rate property test of the control valve $V_0$ in FIG. 3.

FIG. 4 is an illustrative diagram for performing a flow-rate property test of control valve $V_0$ at the time of actuation at a high temperature as shown in FIG. 3. In the property test, $N_2$ gas was distributed from an $N_2$ gas source through decompressor RG regulated to 200 KPaG, mass flow controller MFC having a full scale of 500 SCCM, pressure regulating device TA having a set pressure of 100 Torr, heating pipe HP having a length of 6.35 mm φ×200 mm, and control valve $V_0$ of the automatic pressure regulating device 15, while evacuation was performed by the vacuum pump 14. In this state, the flow-rate properties (relationship between the applied piezoelectric voltage V and the flow rate SCCM) obtained when the temperature of the valve body 19 was adjusted to room temperature (RT) and to 150° C., were each measured when the material of the diaphragm retainer 21 was an invar (36% Ni—Fe) material, a SUS316 material, and a Vespel (SP-1) material.

Figure 5:
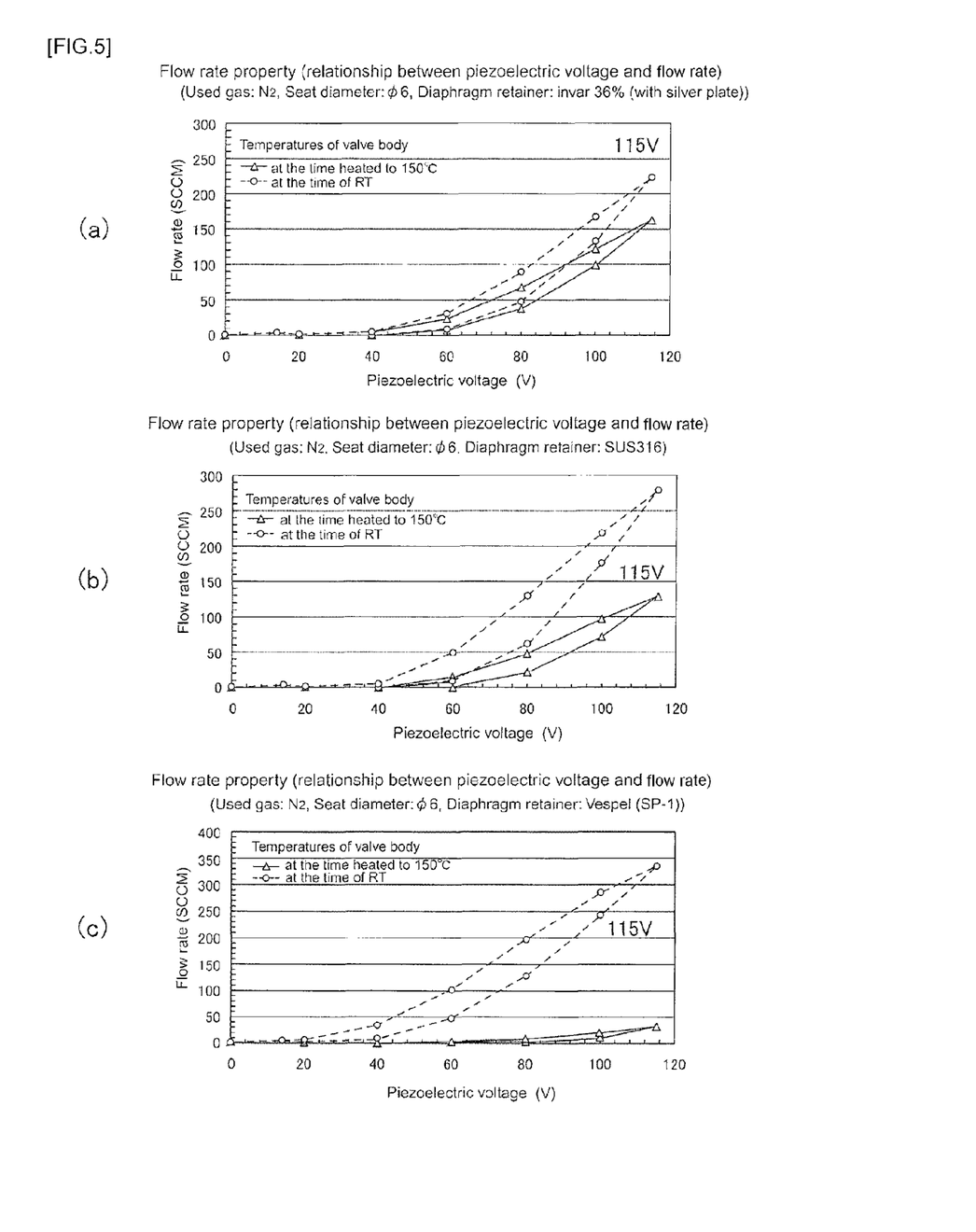

FIG. 5(a) is a graph that shows the flow-rate property obtained when the material of the diaphragm retainer 21 was the invar (36% Ni—Fe) material. FIGS. 5(b) and 5(c) show the flow rate properties obtained when the materials were the SUS316 material and the Vespel (SP-1) material respectively. The graphs illustrate that when the invar (36% Ni—Fe) material was used as the diaphragm retainer, there was less change in the flow rate at a high temperature (temperature of 150° C.).

Tables 2, 3, and 4 show the change in the dimensions of the valve stroke when the applied piezoelectric voltage is set at 115V. Tables 2, 3, and 4 correspond to FIGS. 5(a), 5(b), and 5(c) respectively.

TABLE 2

Change in the dimension of the stroke before and after heating

| | |
|---|---|
| (1) Stroke dimension when heated to 150° C. (applying piezoelectric voltage of 115 V) | 8.3 μm |
| (2) Stroke dimension at RT (applying piezoelectric voltage of 115 V) | 9.5 μm |
| (3) Amount of change in the dimension of the stroke ((1) − (2)) | −1.2 μm |

TABLE 3

Change in the dimension of the stroke before and after heating

| | |
|---|---|
| (1) Stroke dimension when heated to 150° C. (applying piezoelectric voltage of 115 V) | 6.5 μm |
| (2) Stroke dimension at RT (applying piezoelectric voltage of 115 V) | 11.9 μm |
| (3) Amount of change in the dimension of the stroke ((1) − (2)) | −5.4 μm |

TABLE 4

Change in the dimensions of the stroke before and after heating

| | |
|---|---|
| (1) Stroke dimension when heated to 150° C. (applying piezoelectric voltage of 115 V) | 1.6 μm |
| (2) Stroke dimension at RT (applying piezoelectric voltage of 115 V) | 14.2 μm |
| (3) Amount of change in the dimension of the stroke ((1) − (2)) | −12.6 μm |

The dimension of each valve stroke in Tables 2, 3, and 4 was calculated using the following equations.

$$Cv = Qg/(203 P_1) \times (Gg \times T)^{1/2} \quad (1)$$

$$17 \times Cv = \alpha \times A \quad (2)$$

$$h = (1000 \times A)/(\pi \times d) \quad (3)$$

In the equations, Cv is a value indicating flowability of the fluid, $P_1$ is the absolute pressure on the upstream side (kgf/cm²×abs), Qg is the gas flow rate in a normal state (Nm³/h), Gg is the specific gravity of fluid (air=1), T is the fluid temperature (K), α is the correction factor (using 0.8), A is the effective sectional area of the fluid path (mm²), π is the circle ratio, d is the diameter of the valve seat sheet (mm), and h is the stroke dimension (μm).

Figure 6:
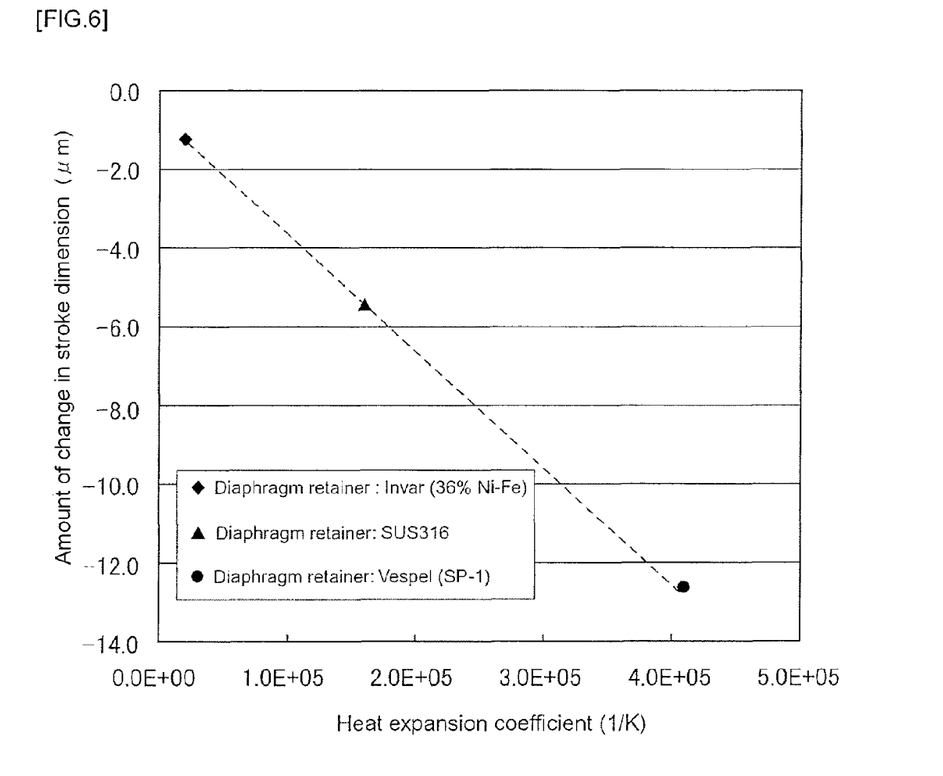
FIG. 6 is a graph showing the relationship between the heat expansion coefficient (1/K) of the material from which the diaphragm retainer in the control valve $V_0$ in FIG. 3 is formed and the amount of change in stroke dimensions during temperature variations.

FIG. 6 is a graph which shows the relationship between the amount of change in the stroke dimension during the temperature variations shown in Tables 1, 2, and 3, and heat expansion coefficients of the diaphragm retainer material (invar (36% Ni—Fe)=$2.0 \times 10^{-6}$, SUS316=$16 \times 10^{-8}$, Vespel (SP-1)=$41 \times 10^{-6}$ (1/K)). It was revealed that in the control valve $V_0$ of the structure shown in FIG. 3, the heat expansion coefficient of the material of the diaphragm retainer 21a and the amount of change in the valve stroke dimension during temperature variation are proportional.

In other words, in the control valve $V_0$ having the configuration as shown in FIG. 3, it can be said that as a high-temperature countermeasure, the most desirable configuration is to use the material with the smaller heat expansion coefficient as the diaphragm retainer 21a, here, invar (36% Ni—Fe).

Figure 7:
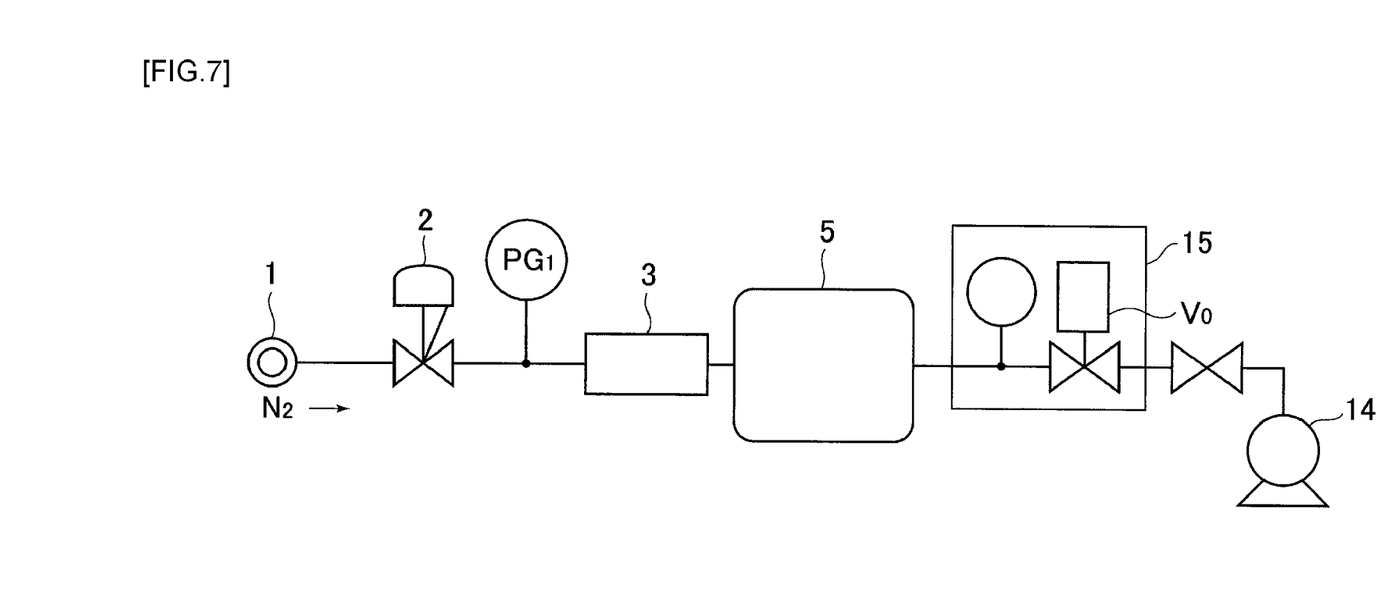
FIG. 7 is an illustrative diagram of an embodiment for performing a response property test of an evaporation supply apparatus for a raw material according to the present invention.
Figure 8A:
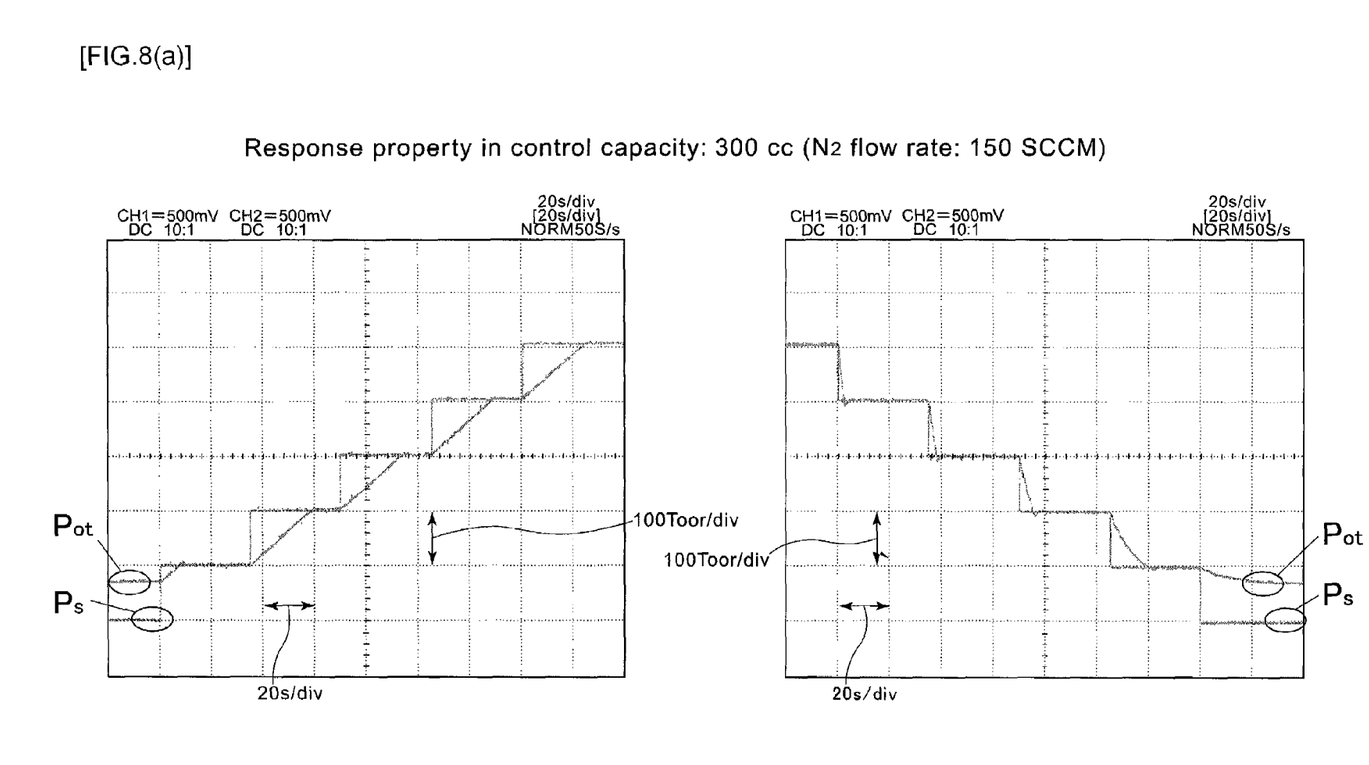
Figure 8B:
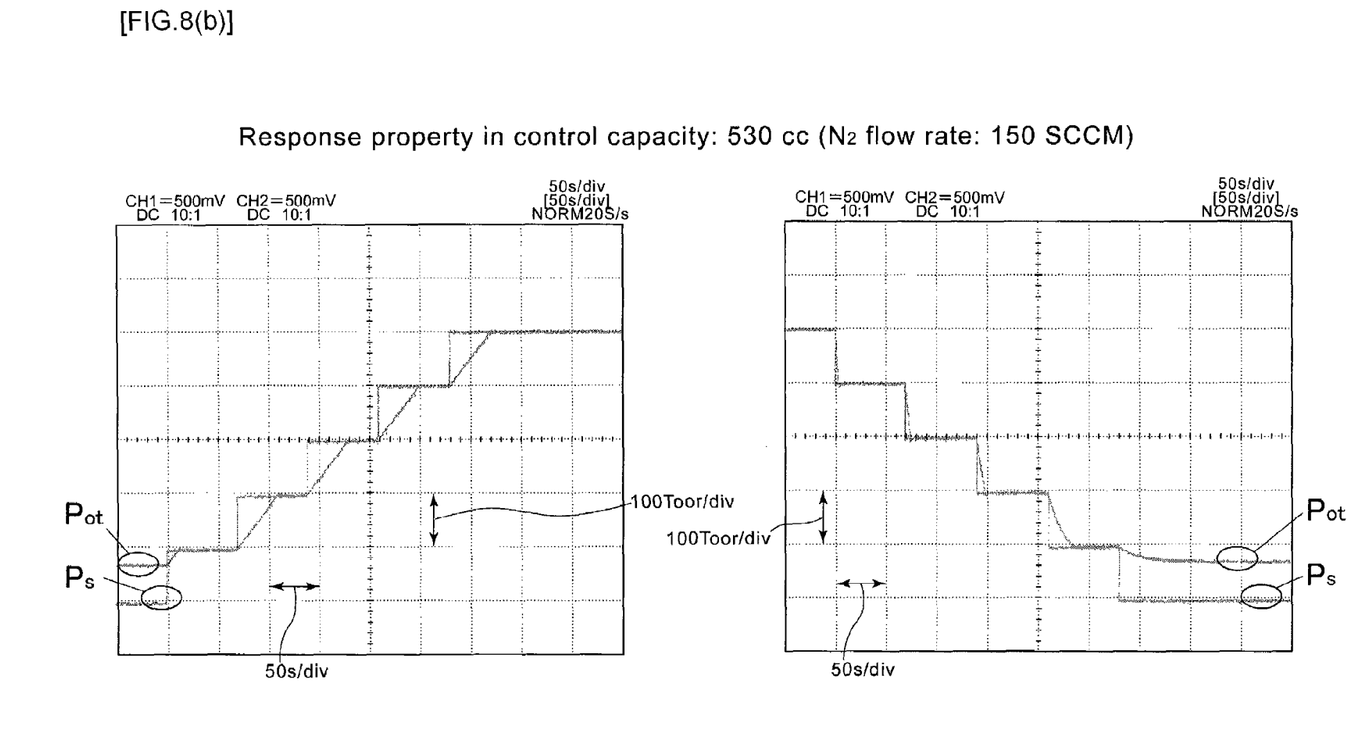

FIG. 7 is an illustrative diagram for performing a response property test of an organic metallic evaporation supply apparatus according to the present invention. In the response property test, $N_2$ from the carrier gas supply source 1 was decompressed to 200 kPaG by the decompressor 2. The resultant $N_2$ was thereafter supplied to a virtual source tank (capacity, 1000 cc; inner pressure, 100 to 500 Torr) 5 through the mass flow control device 3 with a full scale of 500 SCCM. The pressure in the source tank 5 was controlled to a predetermined value from 100 to 500 Torr by the automatic pressure regulating device 15, while $N_2$ of 150 SCCM was distributed into a tube path evacuated to 20 to 50 Torr by the vacuum pump 14. In this example, the relationship between the set pressure input signal Ps added to the input signal terminal 17 and the controlled-pressure output signal (inner pressure of the source tank 5) $P_0$t from the output signal terminal 18 was actually measured. As is clear from FIGS. 8(a) and 8(b), the inner pressure of the source tank 5 can be controlled to a predetermined value without causing a large temporal delay between the set pressure input signal Ps and the controlled-pressure output signal.

INDUSTRIAL APPLICABILITY

The present invention can be applied not only to an evaporation supply apparatus for a raw material used in the MOCVD method, but also to a so-called gas supply apparatus configured so that gas is supplied from a pressurized reservoir source to a process chamber in a semiconductor manufacturing apparatus or a chemical product manufacturing apparatus, etc.

Likewise, the automatic pressure regulating device according to the present invention can be applied not only to an evaporation supply apparatus for a raw material used in the MOCVD method but also may be applied widely to a fluid supply circuit such as a semiconductor manufacturing apparatus or a chemical product manufacturing apparatus, etc., as an automatic pressure regulating device of the fluid supply source on the primary side.

What is claimed is:

1. An evaporation supply apparatus for a raw material, comprising:
    a source tank in which a raw material is pooled;
    a flow rate control device that, while regulating a flow rate of a carrier gas $G_1$ at a constant flow rate from a carrier gas supply source, supplies the carrier gas $G_1$ into the raw material in the source tank;
    a primary piping path for feeding a mixed gas $G_0$, wherein the mixed gas is made up of raw material vapor $G_4$ and carrier gas $G_1$ pooled in an upper space of the source tank;
    an automatic pressure regulating device that regulates a control valve interposed in a tail end of the primary piping path based on detected pressure and temperature values of the mixed gas $G_0$ in the primary piping path to regulate the cross-sectional area of a passage through which the mixed gas $G_0$ is distributed so as to hold the pressure of the mixed gas $G_0$ inside the source tank at a constant value; and
    a constant-temperature heating unit for heating to a set temperature the source tank,
    wherein
    the mixed gas $G_0$ is supplied to a process chamber while controlling the pressure inside the source tank.

2. The evaporation supply apparatus for according to claim 1, wherein the maximum heating temperature of the constant-temperature heating unit is set at 150° C.

3. The evaporation supply apparatus for according to claim 1, wherein
the control valve of the automatic pressure regulating device is a piezoelectric-element-driven normally-closed metal diaphragm valve, and wherein a diaphragm retaining member for pressing a diaphragm valve body of the metal diaphragm valve is made of invar (36% Ni—Fe).

4. An automatic pressure regulating device for a source tank inner pressure for use in an evaporation supply apparatus for a raw material, comprising:
    a pressure detector P, interposed in a primary piping path for supplying a mixed gas, for detecting an inner pressure of the mixed gas $G_0$, wherein the mixed gas $G_0$ is made up of a carrier gas $G_1$ and a raw material vapor $G_4$ fed from the source tank of the evaporation supply apparatus;
    a temperature detector T for detecting the temperature of the mixed gas $G_0$;
    a piezoelectric-element-driven metal-diaphragm control valve directly connected to a tail end of the primary piping path;
    an arithmetic control unit for performing a temperature correction of the detected inner pressure value obtained by pressure detector P based on a detected value obtained by the temperature detector T so as to compute a corrected pressure of the mixed gas $G_0$, and output a control signal Pd to control opening and closing the control valve, obtained by comparing a previously set pressure and the computed pressure; and a heater for heating the pressure detector, the temperature detector, and the control valve to a predetermined temperature, wherein the pressure of the mixed gas $G_0$ inside the source tank is held at a predetermined value so as to highly accurately control the supply flow rate of the raw material.

5. The automatic pressure regulating device according to claim 4, wherein the arithmetic control unit comprises:

a temperature correction circuit for temperature-correcting the detected pressure signal $P_0$ to compute a corrected pressure signal Pt;

an input/output circuit for a set input signal Ps and a controlled-pressure output signal $P_0$t;

a comparison circuit for the corrected signal Pt under a reference temperature and the set input signal Ps under a reference temperature; and an output circuit for outputting a control signal Pd in a direction in which a difference signal between the corrected pressure signal Pt and the set input signal Ps is rendered zero.

6. The automatic pressure regulating device according to claim 4, wherein the valve body is set at a maximum temperature of 150° C., and wherein a diaphragm retainer of the control valve is made of invar (36% Ni—Fe).

7. The automatic pressure regulating device according to claim 4, wherein the control valve is configured such that a main body of a case thereof is a holed chassis provided with a large number of opening holes, and, the control valve is normally closed, wherein during non-actuation of a piezoelectric element drive unit, a diaphragm valve body is downwardly pressed via a diaphragm retainer by elastic force of a disc spring that is in contact with a valve seat, and wherein at the time of actuating the piezoelectric element drive unit, the diaphragm retainer is upwardly pulled up against the elastic force of the disc spring by extension of the piezoelectric element, whereby the diaphragm valve body is unseated from the valve seat.

8. The automatic pressure regulating device according to claim 4, wherein at least one of the diaphragm retainer and a top surface side of the diaphragm is plated with silver so as to prevent seizing caused by sliding friction between the diaphragm retainer and the diaphragm.

* * * * *